United States Patent [19]
Haj-Ali-Ahmadi et al.

[11] Patent Number: 5,148,003
[45] Date of Patent: Sep. 15, 1992

[54] MODULAR TEST OVEN

[75] Inventors: Javad Haj-Ali-Ahmadi, Austin; Jerome A. Frankeny, Taylor; Richard F. Frankeny, Austin; Adolph B. Habich, Georgetown; Karl Hermann, Austin; Ronald E. Hunt, Georgetown, all of Tex.

[73] Assignee: International Business Machines Corporation, Armonk, N.Y.

[21] Appl. No.: 619,369

[22] Filed: Nov. 28, 1990

[51] Int. Cl.$^5$ .............................................. H05B 1/00
[52] U.S. Cl. .................... 219/388; 219/209
[58] Field of Search ............... 219/209, 210, 388, 385, 219/386, 85.12, 85.16, 85.17, 85.19

[56] References Cited

U.S. PATENT DOCUMENTS

| | | | |
|---|---|---|---|
| 2,332,368 | 10/1943 | Burtenshaw | 219/85.16 |
| 3,604,108 | 9/1971 | Mallery | 219/85.19 |
| 4,374,317 | 2/1983 | Bradshaw | 219/385 |
| 4,379,259 | 4/1983 | Varadi et al. | |
| 4,561,040 | 12/1985 | Eastman et al. | 361/385 |
| 4,633,175 | 12/1986 | Ritchie et al. | 324/158 |
| 4,695,707 | 9/1987 | Young | 219/392 |
| 4,698,774 | 10/1987 | Abe | 219/388 |
| 4,729,060 | 3/1988 | Yamamoto et al. | 361/385 |
| 4,775,776 | 10/1988 | Rahn | 219/388 |
| 4,833,301 | 5/1989 | Futek | 219/388 |
| 4,855,672 | 8/1989 | Shreeve | 324/158 |
| 4,881,591 | 11/1989 | Rignall | 165/26 |
| 4,918,385 | 4/1990 | Shreeve | 324/158 |
| 5,003,160 | 3/1991 | Matsuo | 219/388 |
| 5,039,841 | 8/1991 | Kato | 219/388 |

FOREIGN PATENT DOCUMENTS

0151068 8/1985 European Pat. Off.
0151546 8/1985 European Pat. Off.

OTHER PUBLICATIONS

IBM Technical Disclosure Bulletin "Chip Packaging Structure With Enhanced Cooling", vol. 20, No. 5, Oct. 1977, pp. 1772-1773.
IBM Technical Disclosure Bulletin "Modified Bellows Conductive Cooling", vol. 20, No. 11A, Apr. 1978, pp. 4391-4392.
IBM Technical Disclosure Bulletin "Self-Regulating Evaporative/Conductive Thermal Link", vol. 21, No. 8, Jan. 1979, pp. 3281-3282.
IBM Technical Disclosure Bulletin "Thermally Enhanced Self Leveling/Positive Contact Substrate Cap", vol. 23, No. 2, Jul. 1980, pp. 541-542.
IBM TDB, "Module Thermal Test Chamber," vol. 24, No. 9, Feb. 1982, pp. 4650-4651.
IBM TDB, "Automated Module Preheat Oven," vol. 25, No. 1, Jun. 1982, pp. 263-264.
IBM TDB, "Multiple Chip Heat Sink Package," vol. 29, No. 6, Nov. 1986, pp. 2584-2585.
IBM TDB, "Generic Burn-in for LOCST Chips," vol. 32, No. 4A, Sep. 1989, pp. 22-23.
IBM TDB, "Non-Permanent Mounting Technique for Test and Burn-in of C4 Devices," vol. 32, No. 5A, Oct. 1989, pp. 70-71.
IBM TDB, "Technique for a Dynamic Burn-in Test," vol. 32, No. 8B, Jan. 1990, pp. 303-305.

Primary Examiner—Teresa J. Walberg
Attorney, Agent, or Firm—Mark E. McBurney

[57] ABSTRACT

A method and apparatus is provided for testing integrated circuits and permanently affixing the ICs which are successfully tested to a product level carrier substrate. A modular test oven is used which allows the chips to be electrically and thermally tested with the chips non-permanently affixed to a carrier substrate. If all of the chips on the carrier substrate test good, then the temperature within the oven is elevated, thereby reflowing the solder balls and permanently affixing the chips to the carrier substrate. This card can then be used in the manufacture of an electronic device without the necessity of reworking the burned-in ICs. Further, if any of the chips fail the burn-in testing, the time and overhead required for reworking is minimized since the chips are not permanently attached.

14 Claims, 6 Drawing Sheets

MODULAR TEST OVEN

BACKGROUND OF THE INVENTION

The present invention generally relates to the testing and placement of electronic components. More particularly, this invention relates to the burn-in and placement of integrated circuits (ICs or chips) on to a carrier substrate or circuit card which will ultimately be used in the manufacture of electronic devices, such as computers, or the like. Burn-in is a process of testing ICs by elevating their temperature and simultaneously performing electrical testing thereon. The present invention provides for simultaneous burn-in and direct chip attachment of multiple chips on to the carrier substrate. This direct chip attachment is a card fabrication process which results in permanent placement of ICs on the carrier substrate.

Conventional systems perform burn-in as a separate and distinct operation when compared with the circuit card fabrication process. For example, U.S. Pat. No. 4,881,591 describes a variable temperature oven having an associated computer for monitoring the electrical testing of the ICs, simultaneous with their exposure to the elevated temperatures of the oven. Burn-in boards are used to mount the ICs during the burn-in testing process. Further, U.S. Pat. No. 4,379,259 discuses a burn-in technique where ICs are mounted on PC storage cards which are then placed in an environmental chamber that elevates the temperature. The PC cards are constructed to isolate individual ICs which ensures burn-in of each chip. After burn-in, the PC cards are removed from the chamber and the ICs are removed from the card. The defective ICs are then separated from the good ICs, which are subjected to one by one short functional testing. U.S. Pat. No. 4,908,385 describes the electrical circuitry typically utilized for testing of ICS during burn-in. IBM Technical Disclosure Bulletin, Vol. 32, No 5A, October, 1989, "Non-Permanent Mounting Technique for Test and Burn-in of C4 Devices" describes a system in which a weight is applied to the top of the chip, making non-permanent electrical contact through the C4 solder ball with the vias of a text mount carrier substrate metallization.

Additionally prior art burn-in systems provide a global elevation in temperature within the test chamber, which may result in stress to the carrier substrate material. The conventional burn-in techniques address the problem of stress of the carrier substrate by using a carrier substrate for burn-in which will not ultimately be used in the product. Finally, the previously discussed stress to the carrier substrate is amplified due to the long time periods required by conventional systems to "ramp up" to burn-in temperatures.

Thus, it can be seen that conventional burn-in requires removal of the ICs after testing from a burn-in board, PC storage card, or the like. It would be advantageous to a circuit board manufacturer to have the ability to test ICs and fabricate a circuit board in a single process, thereby increasing efficiency and saving a great deal of time and overhead.

SUMMARY OF THE INVENTION

In contrast to the prior art, the present invention provides a means of performing burn-in of ICs and, with the same operation, permanently affixing the the ICs on to a circuit card, or the like. Conventional burn-in processes are utilized to test a completed end product, i.e. the chips have been permanently affixed to the carrier substrate prior to testing. Thus, in the case of chip failure during burn-in the completed product is either discarded, or must undergo extensive and costly reworking operations. On the other hand, the present invention tests the chips prior to the product being completed, i.e. the ICs are not yet permanently affixed to the carrier substrate. Therefore, any reworking required due to chip failure during burn-in is very simple and inexpensive when compared to conventional burn-in systems and methods. However, if testing of the chips is successful the present invention permanently attaches the ICs to a "product level" carrier substrate.

The present invention includes a modular test oven, or burn-in oven which is capable of receiving a carrier substrate having a plurality of ICs temporarily affixed thereto. The modular ovens are capable of being arranged such that a robot can be used to continually insert and retrieve substrates with their associated plurality of chips.

The present invention provides for the application of pressure between the IC and the carrier substrate such that an electrical connection can be made therebetween, without forming a permanent bond. Additionally, a point heating source is provided which solves two major problems of conventional systems. First, only the IC is heated, which drastically reduces the heat stress experienced by the carrier substrate material. This is extremely significant since the carrier substrate utilized by the present invention is a product level material. Secondly, the time required to reach burn-in temperature is also reduced, since only the chip itself is being heated, not the entire chamber within the test oven.

Electrical testing is performed while the chip is at burn-in temperature. If the electrical tests are satisfactory, then the temperature within the oven can be further elevated, thereby implementing metallurgy joining, such as reflowing the solder, and permanently affixing the ICs to the carrier substrate. The robot then removes the carrier substrate and ICs, which are now ready for placement on a computer circuit board, or the like. Should it be determined that one of the chips did not pass the electrical tests, the robot is programmed to remove the chips (without reflowing the solder) and discard or replace the bad ones, while saving the good chips for future use. Thus, the present invention improves manufacturing processes and unit lot size production is increased.

Therefore, in accordance with the previous summary, objects, features and advantages of the present invention will become apparent to one skilled in the art from the subsequent description and the appended claims taken in conjunction with the accompanying drawings.

BRIEF DESCRIPTION OF THE DRAWINGS

FIG. 9 is a heat sink which may be used in conjunction with the point heat source of the present invention when logic, or other high power chips are being burned-in.

DETAILED DESCRIPTION OF THE PREFERRED EMBODIMENTS

Figure 1:
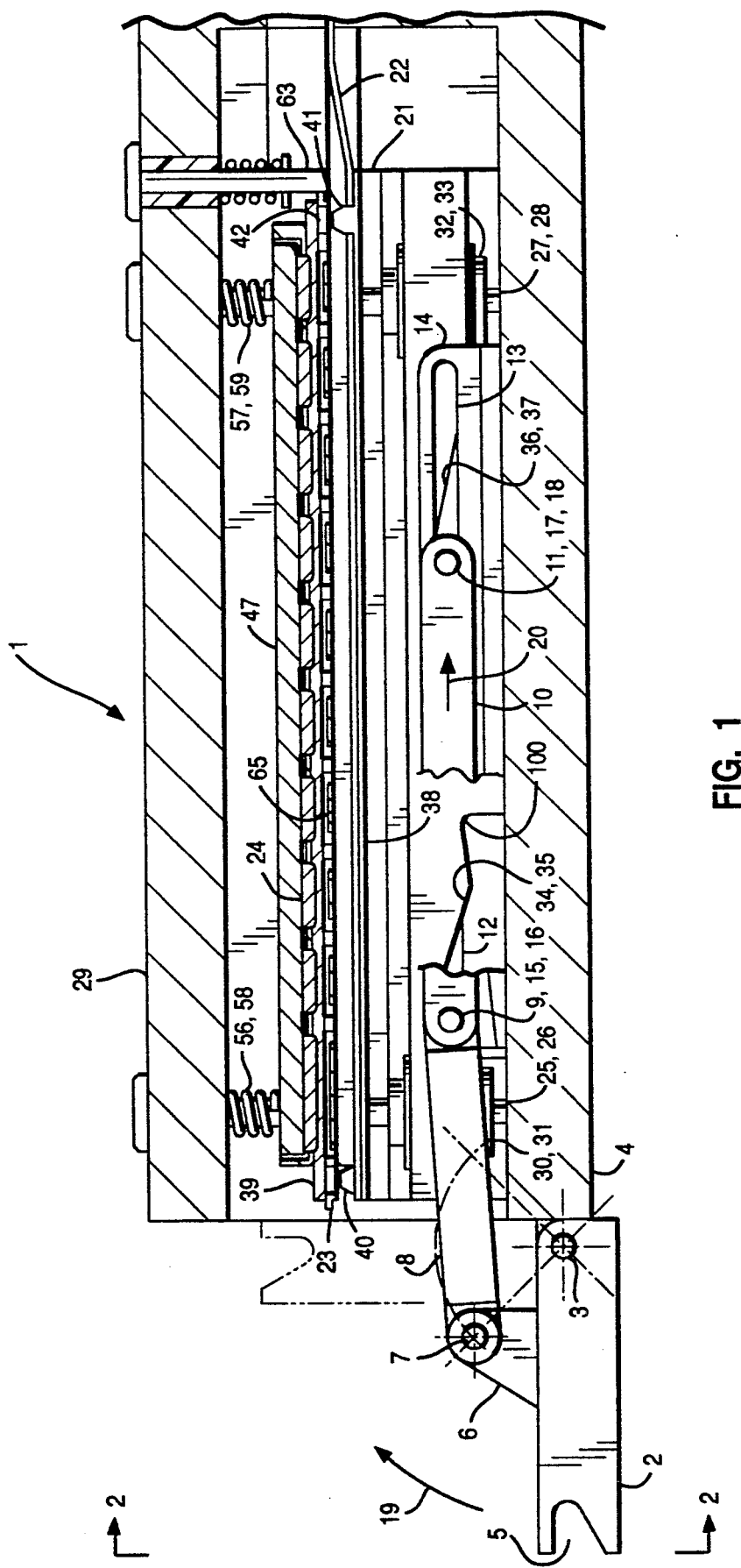
FIG. 1 is a side elevation cross-section of the modular test oven of the present invention.
Figure 4:
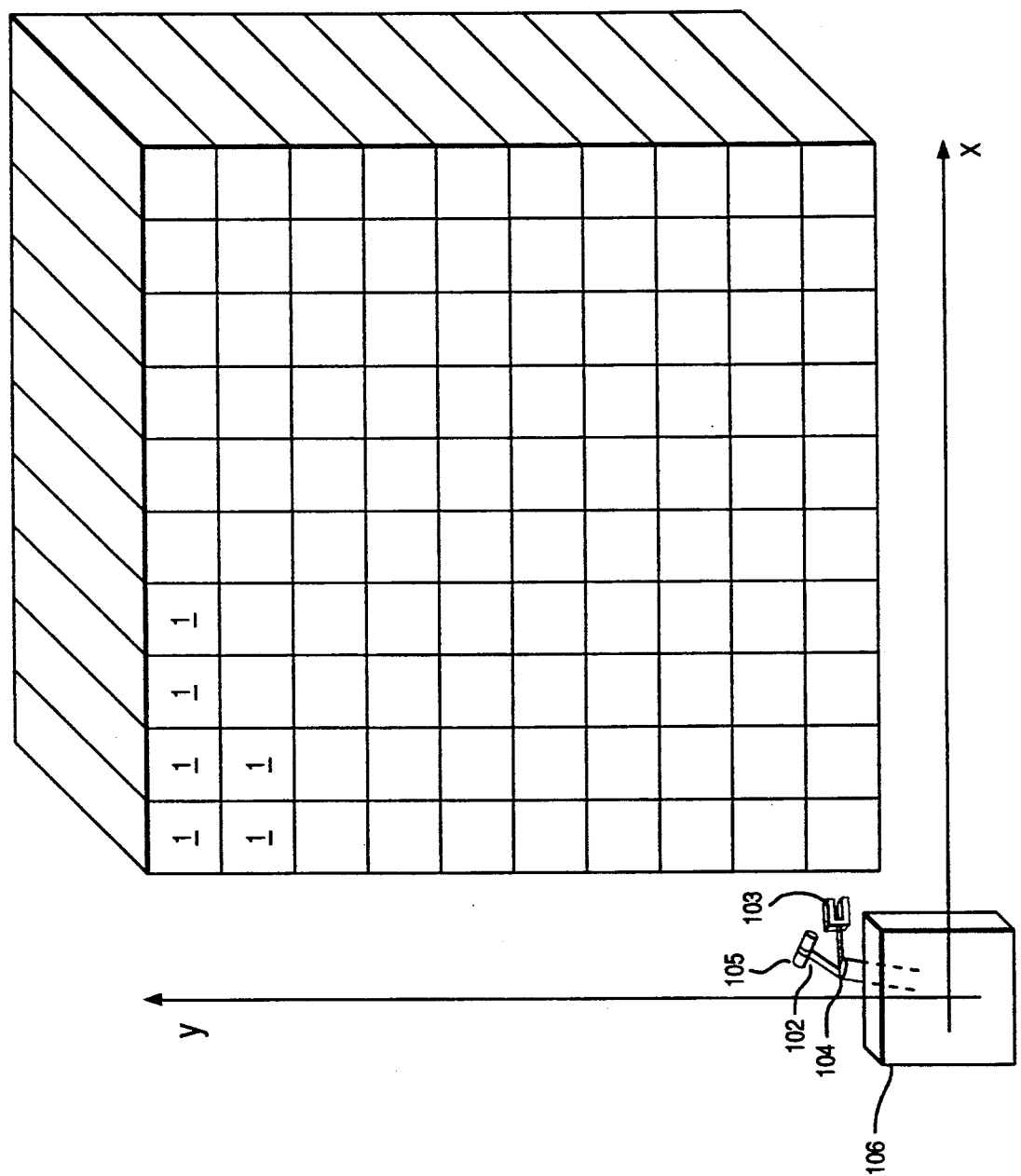
FIG. 4 depicts a plurality of modular test ovens and a robot as contemplated by the present invention.

Referring to FIG. 1 a side elevation view of the modular test oven of the present invention is shown and generally designated by reference numeral 1. An oven door 2 is included for the purpose of providing an opening such that a carrier substrate having a plurality of chips associated therewith can be inserted into and retrieved from the modular test oven. Oven door 2 includes groove 5 which is shaped to be in mechanical communication with an end-of-arm robot tool (not shown) which will facilitate the opening and closing of oven door 2 when used in conjunction with a robot (FIG. 4). Door 2 also serves as a linkage for transferring force from the robot arm to the test oven apparatus such that the necessary internal mechanical motions will take place. Oven door 2 pivots about pin 3 which is fixedly attached to a frame bottom 4 of the test oven of the present invention. A pivot block 6 and pin 7 are included inside of door 2 and allow force from the robot arm to be transferred to the test oven mechanism via linkage member 8. Linkage member 8 pivots about pin 7 and is further pivotably attached on the other end through pin 9 to a bearing truck member 10. Truck member 10 is fixed at pin 9 and further fixed at a pin 11 which is disposed on the opposite end thereof. Fixed pins 9 and 11 slide in horizontal slots 12 and 13 respectively. The frame member 14 is rigidly affixed to frame bottom 4 and contains horizontal slots 12 and 13. Pin 9 is supported at each end by bearing rollers 15 and 16 which are rotatively attached thereto. Similarly, the ends of pin 11 are supported by bearing rollers 17 and 18 which are also rotatably attached thereto.

Next, as door 2 is closed in the direction of arrow 19, link 8 transfers the force to truck member 10 which moves the attached rollers 15, 16, 17, 18 in a direction that is shown by arrow 20.

A lift platform 21 is shown and is moved vertically by the mechanism of oven door 2, as described above. A connector cable 22 is also provided which allows a test circuit (not shown) to be connected, e.g. to a memory frame module 23 which is a production level carrier substrate upon which integrated circuits are to be mounted. It should be noted that a memory frame module is used as an example and should not be construed as a limitation. Other types of modules, such as logic, or mixed modules are contemplated by the present invention. The vertical movement of lift platform 21 is then utilized to lift the combination of the connector table and module 23 into contact with a point heat source 24. This vertical movement will hereinafter be described in further detailed. Vertical guide shafts 25, 26, 27 and 28 are rigidly affixed to the 4 corners of the bottom frame plate 4 and a top frame plate 29, respectively. Further cam slots 34, 35, 36 and 37 are located in the sides of lift platform 21. Rollers 15, 16, 17 and 18 of truck 10 are contained within, and in communication with cam slots 34, 35, 36 and 37, respectively. As oven door 2 is closed, truck 10 and the associated rollers 15, 16, 17 and 18 move horizontally in the direction of arrow 20, thereby raising platform 21 through the interaction of rollers 15, 16, 17 and 18 with cam slots 34, 35, 36 and 37, respectively. In a similar manner it can be seen how the opening of door 2 will lower platform 21, since rollers 15, 16, 17 and 18 will move in a horizontal direction away from cam slots 34, 35, 36 and 37 thereby disengaging themselves therefrom. Additionally, when door 2 is closed there is a locking angle 100 which is present adjacent cam slots 34, 35, 36 and 37 which will act to detect the door in a closed position.

Electrical cable strip 22 is fixedly attached to flat surface 38 which is disposed on the top of lift platform 21. Electrical cable strip 22 includes an associated pattern of electrical contact points (not shown) which contact carrier substrate 23 and are used to perform electrical testing. Additionally, aligning pins 40 and 41 protrude upward from surface 38 of lift platform 21.

Next, a description of the insertion and alignment of a module frame 23 into the test oven 1 of the present invention will be provided. The carrier substrate 23 is selected from a bin by a robot having a gripper 103 as may be used in conjunction with a robot 106 (FIG. 4) which includes an arm 104 and an attachment means 102.

It should be noted that attachment means 102 may include an end-of-arm tool 105 as previously described which will fit with groove 5 of oven door 2, and may include a gripper 103 for placing the carrier substrate into the oven 1. Further, a robot 106, having multiple arms and multiple end-of-arm tools, grippers or the like is contemplated by the present invention.

Figure 2:
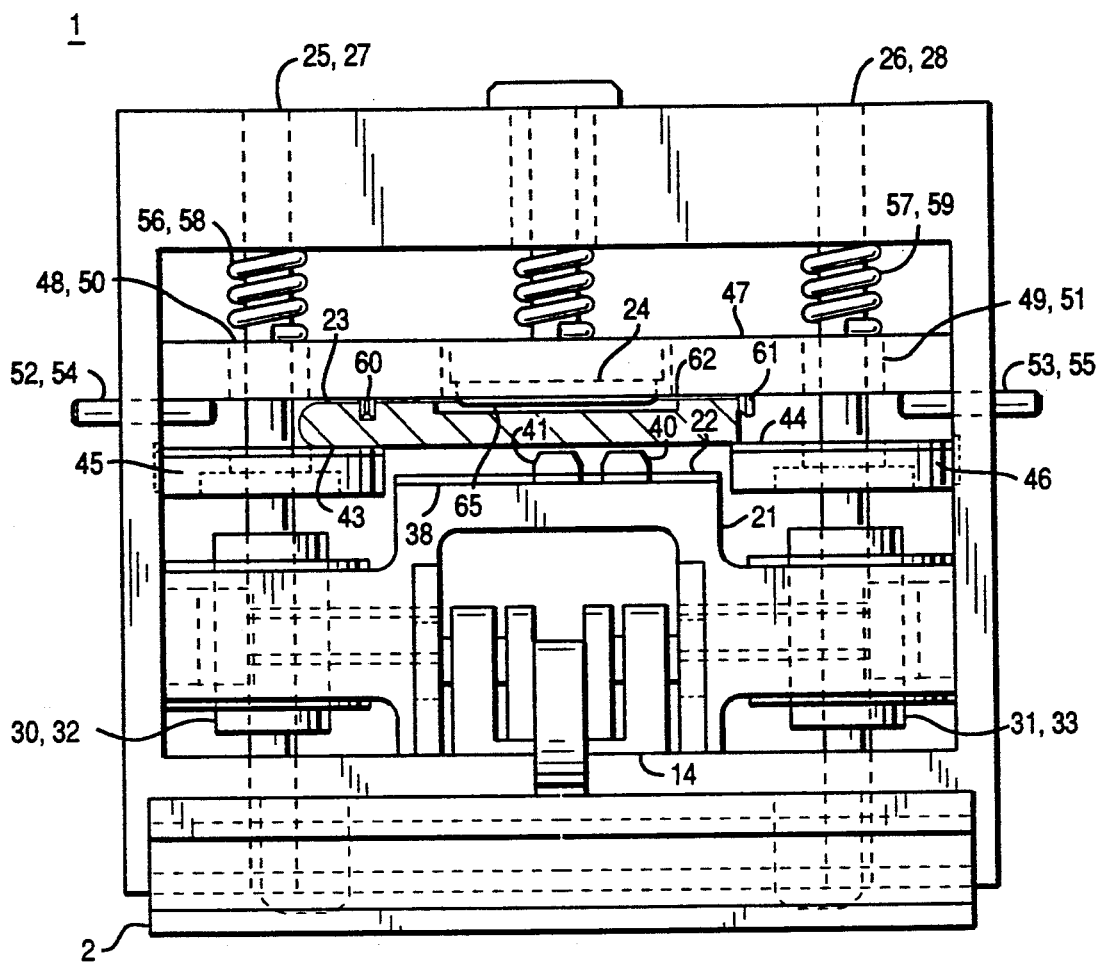
FIG. 2 is a front elevation cross-section of the modular test oven.

Carrier substrate 23 is placed by robot 106 into test oven 1 by inserting the carrier substrate onto surfaces 43 and 44 of frame protrusions 45 and 46, respectively (FIG. 2). It can be seen that frame protrusions 45 and 46 serve as a bottom support for carrier substrate 23. Top plate 47 is provided including surfaces 60, 61 and 62 disposed on the underside thereof which provide for the initial positioning of carrier substrate 23. It can be seen that surfaces 60 and 61 each form a shoulder which function to guide carrier substrate 23 during its insertion into test oven 1. In this manner, carrier substrate 23 is axially aligned with oven 1. A pin 63 is disposed at the end of oven 1 opposite of door 2 and serves to stop the inward movement of carrier substrate 23 into oven 1 (FIG. 1). It should be noted that stop pin 63 has a spring yield in the vertical direction which biases pin 33 away from cable 22, thereby preventing interference therewith when the oven door 2 is closed and cable 22 is raised.

As can be seen by FIG. 2, plate 47 includes bushings 48, 49, 50 and 51 which are associated with shafts 25, 26, 27 and 28, respectively. These bushings allow vertical movement of plate 47, on shafts 25, 26, 27 and 28. Pins 52, 53, 54 and 55 are provided which inhibit the downward movement of plate 47, as can be seen in FIG. 2. Also, springs 56, 57, 58 and 59 disposed around shafts 25, 26, 27 and 28, respectively, will bias plate 42 down into abutment with pins 52, 53, 54 and 55. It can be seen that due to surfaces 60, 61 and 62 of plate 47, as well as end stop pin 63, carrier substrate 23 (having a plurality of chips non-permanently attached thereto) is in rough alignment within the modular test oven 1. However, further alignment must be implemented in order to ensure that cable 22 will contact the electrical test points of carrier substrate 23 and that point heat source 24 will contact chips 65. As oven door 2 is closed lift platform 21 raises aligning pins 40 and 41 which will be aligned and inserted into holes 39 and 42 of carrier substrate frame 23 respectively. Springs 56, 57, 58 and 59 provide a downward resistance of carrier substrate 23 which will ensure seating on pins 40 and 41 and mating of connector cable 22 to the associated connector points (not shown) on carrier substrate 23 and bottom connection pads (not shown). In the manner as previously discussed, lift platform 21 will continue its upward motion due to the communication of rollers 15, 16, 17 and 18 with cam slots 34, 35, 36 and 37, respectively. Therefore, electronic circuit chips 65 will now mate and be in close alignment with point heat source 24. The pressure between point heat source 24 and integrated circuits 65 will effect transfer of heat to the chips being tested and also provide a uniform downward force which will act to keep the non-permanently affixed chips (unsoldered) in proper alignment during testing. Therefore, it can be seen how the temperature of electronic circuit chips being tested can be elevated during electrical testing thereof without permanently affixing the integrated circuits 65 onto carrier substrate 23, i.e. the elevated temperature is less than that required to reflow the solder.

FIG. 2 is a front view of oven 1 with the door in an open position. The components and elements of the present inventions as previously described can be seen in FIG. 2 and one skilled in the art can appreciate the interrelationship of these components. Basically, it can be seen how carrier substrate 23 is aligned within oven 1 such that cable 22 is in communication therewith and point heat source 24 is in communication with integrated circuit device 65.

Figure 3:
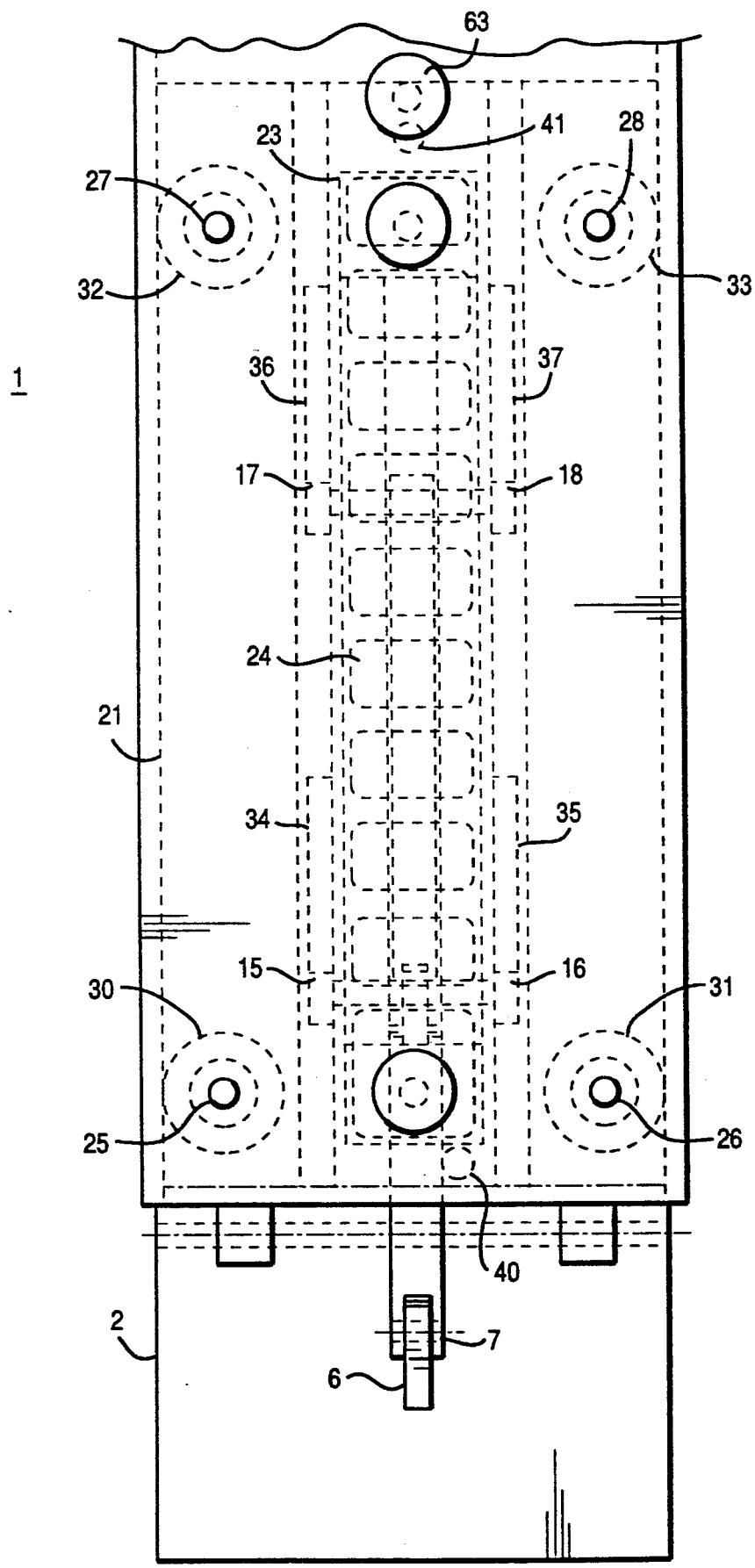
FIG. 3 is a plan view of the modular test oven.

FIG. 3 is a partial cross-section of a plan view of the oven 1. Again, the relationship of the elements of the present invention can be seen and will be appreciated by one skilled in the art. In particular, lift plate 21 can be seen, as well as end stop pin 63. Therefore it can be seen how the inward movement of carrier substrate 23 is restricted upon contact with pin 63. Further, pins 25, 26, 27, 28 and their respective bearings 30, 31, 32 and 33 can be seen such that the ability of lift plate 21 to rise vertically can be appreciated.

FIG. 4 depicts an arrangement of modular test ovens 1 which is contemplated by the present invention. Robot 106 is capable of vertical and horizontal movement such that substrates 23 having ICs attached thereto can be continually inserted and removed from the plurality of modular test ovens 1. Additionally, bins (not shown) containing substrates and ICs to be tested will be provided, as well as bins in which to discard faulty ICs and other bins to store ICs and substrates successfully completing the burn-in testing. It should be noted that some substrates will contain ICs which successfully complete burn-in and others which fail. In this case, since the ICs have not been permanently affixed to the carrier substrate another robot or means are contemplated which can separate the good ICs for subsequent use while discarding the ICs which have failed the burn-in test. Methods of programming robot 106 to insert and retrieve substrates 23 into and from oven 1, are well known in the art. Additionally, methods of programming robot 106 to remove, discard and replace failed ICs are also known and will not be further described.

Figure 5:
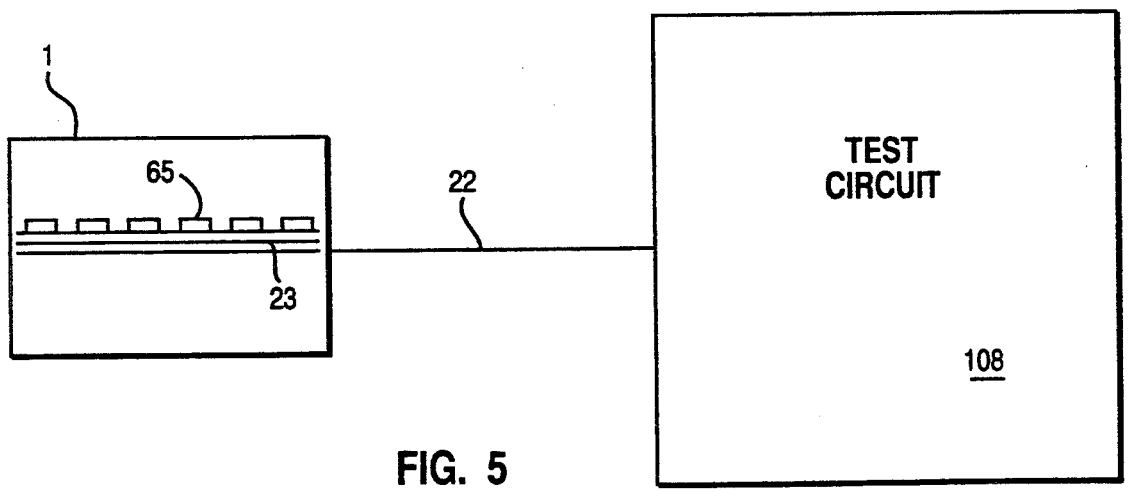
FIG. 5 is a schematic diagram showing the test oven with a plurality of ICs contained therein and a test circuit connected to the ICs.

FIG. 5 is a schematic of a typical arrangement for performing burn-in testing for integrated circuit. Test oven 1 is shown including carrier substrate 23 with a plurality of chips 65 associated therewith. Cable 22 provides interconnection between the carrier substrate 23 and the test circuitry 108. It should be noted that test circuit 108 may be of a type as currently known in the art and illustrated in previously discussed U.S. Pat. No. 4,918,385.

Figure 6:
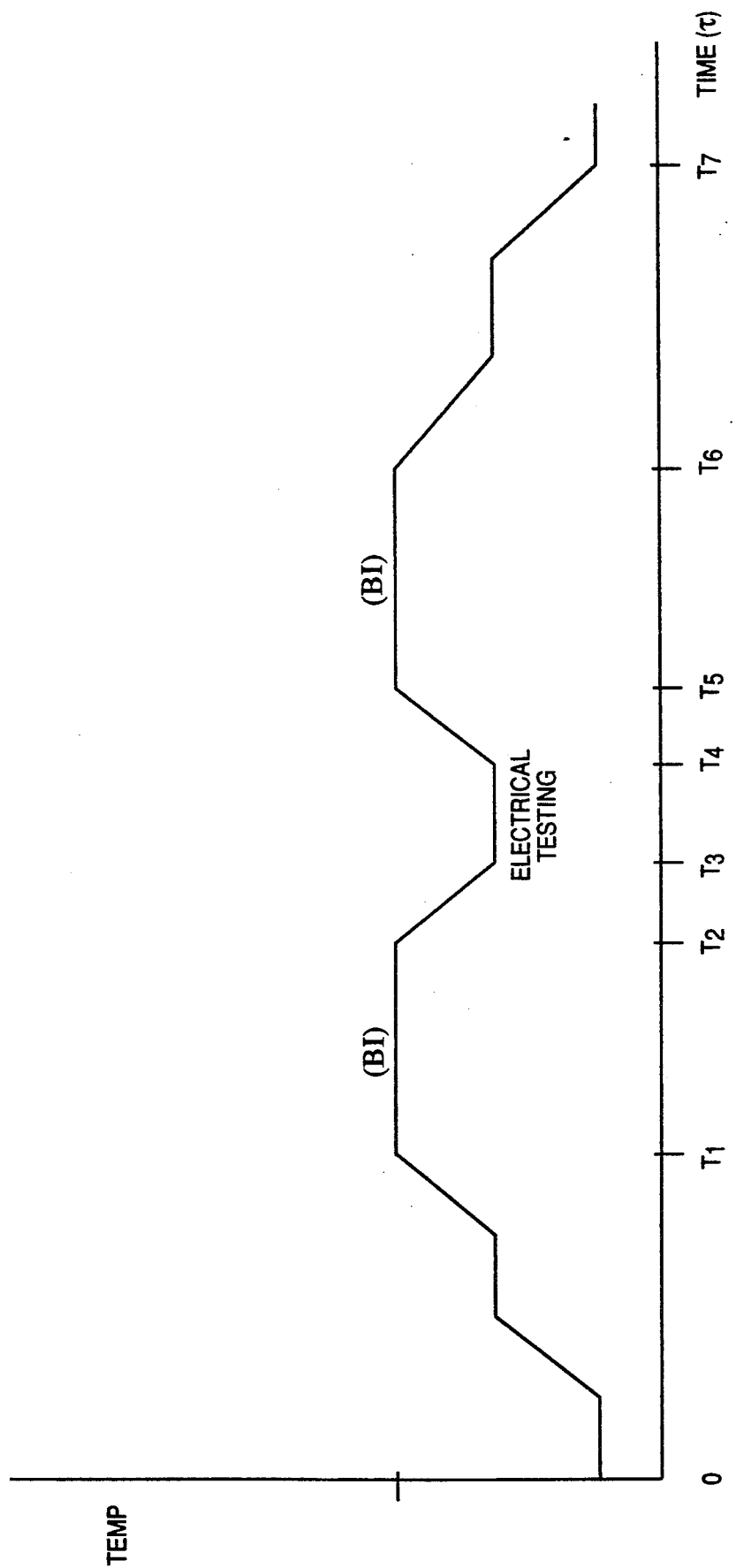
FIG. 6 is a graph illustrating the time required by typical conventional systems to elevate the temperature to burn-in temperatures.

FIG. 6 is a graphical representation of the time required for a conventional burn-in process. It can be seen that the only time when burn-in or electrical testing occurs is during the time from T1 to T2, T3 to T4 and T5 to T6. The remaining time is used to increase or decrease the temperature in order to reach a specific point. Therefore, it can be seen how a point heat source which rapidly increases and decreases the temperature of the ICs, will shorten the ramp periods thereby shortening the entire time period required for burn-in. It should be noted that conventional burn-in may require as much as 15 hours, whereas the present invention is capable of performing burn-in in approximately 5 hours. Therefore it can be appreciated that the flexibility provided, during burn-in, by a point heat source in controlling the acceleration and deceleration of the temperature levels is extremely important.

Figure 7:
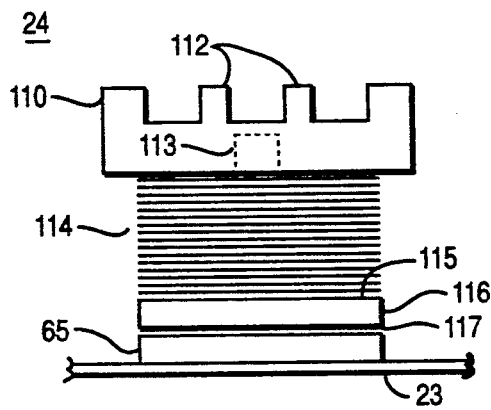
FIG. 7 is an elevation view of the point heat source contemplated by the present invention.

In order to minimize the ramp up and down time for the temperature in the test oven, the present invention eliminates the need to elevate the temperature in the entire oven chamber by providing a point heat source. A point heat source is shown in FIG. 7 and includes a heat sink 112 as is known in the art and utilized to dissipate thermal heating through fins 112. A peltier device 116 is disposed adjacent chip 65 and in contact therewith. A bellows 114 is disposed intermediate heat sink 110 and thermal electrical cooler (TEC) 116 and provides the necessary force to maintain contact between TEC 116 and chip 65, as well assisting as in holding chip 65 in the proper position on carrier substrate 23 during burn-in testing. Suitable engagement means 113 are provided for attaching heat sink 112 with bellows 114. The engagement means may be by threaded engagement or any other suitable attachment.

Figure 8:
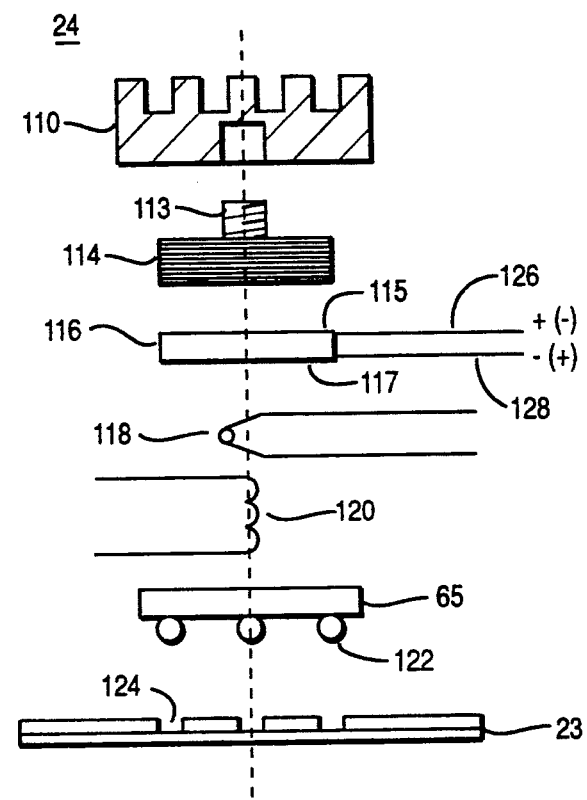
FIG. 8 is an exploded view showing the components of the point heat source.

Referring to FIG. 8, the components of the point heat source 24 are shown and will hereinafter be described in detail. As previously noted, heat sink 110 is of a conventional type and is engaged with bellows 114 via engagement means 113. Bellows 114 will provide pressure between chips 65 and carrier substrate 23 in order to position the chip thereon. Bellows 114 must also be constructed of a thermally conductive material, such as aluminum or the like, such that heat may be transferred therethrough. Thermal electrical cooler 116 includes a first side 115 and second side 117 as well as leads 126 and 128. TEC 116 is of a type as is manufactured by Marlow Industries such that the electrical polarity of leads 126 and 128 determine whether side 115 or 117 will provide cooling or heating. For example, a positive voltage applied at lead 126 with a negative voltage at lead 128 may cause side 117 of TEC 116 to become cooler such that heat is then transferred and dissipated through TEC 116 and out side 115. Alternatively, a positive voltage on lead 128 and a negative voltage on lead 126 will cause side 115 to become cooler such that side 117 dissipates the heat lost from side 115 thereby making side 117 become hotter (TEC 116 operates as a heater with respect to chip 65). Therefore, it can be seen how TEC 116 may be used as either a heater, or cooler with reference to chip 65. A heat sensor 118 is also provided and utilized to control the electrical polarity of leads 126, 128 such that TEC 116 can be used as a heater (to elevate the temperature of chip 65 during burn-in) or as a cooler (to decrease the temperature of chip 65 subsequent to burn-in and in order to maintain a specific temperature of chip 65 due to the inherent heating thereof when an electrical load is applied).

TEC 116 may be constructed of a dielectric type of material such that the elevation and temperature of chip 65 due to inherent loading would cause the polarity of leads 126 and 128 to be such so as to cool chip 65. However, the use of sensor 118 provides a greater degree of control over TEC 116. Therefore, it can be seen that if a lesser degree of control is sufficient for a specific application, sensor 118 may be omitted. A heater 120 is also provided which may include an induction type heating element which aids in the localization of heat transfer. Heater 120 is utilized to aide the TEC 116 during the elevation of the temperature of chip 65 during burn-in. It will be apparent to one skilled in the art, how the addition of heater 120 will function to decrease the "ramp up" time as depicted on FIG. 6, thereby minimizing the total time required for a burn-in. That is, time periods 0 to T1 (FIG. 6) will be minimized as well as time periods T4–T5. It should be noted that sensor 118 and heater 120 are bonded to the thermal electric cooler 116 such that a single unit is presented for contact with chip 65. As noted in FIG. 8 chip 65 includes solder balls 122 attached to the input/output points thereof. Solder balls 122 are in alignment with vias 124 contained with carrier substrate 23. Electrical contact between cable 22 and chip 65 is made through dielectric carrier substrate 23, via 124 and solder balls 122.

Figure 9:
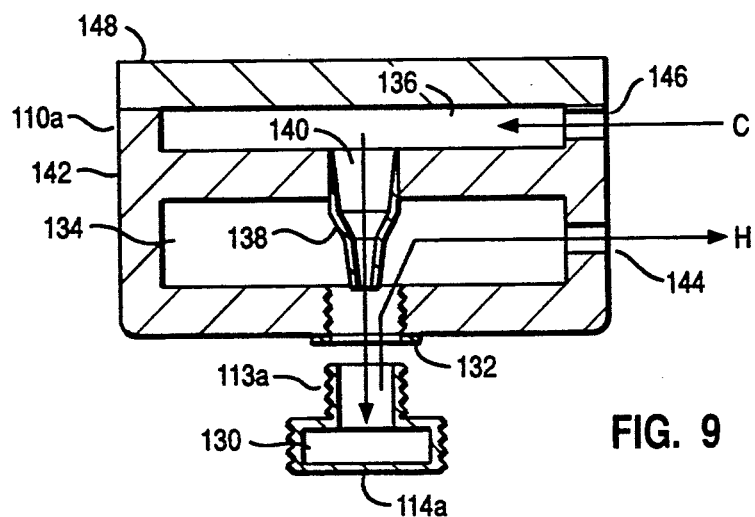

Those skilled in the art will appreciate the discrepancy between the amount of heat dissipated from a memory chip and a logic chip during burn-in. By way of example but not limitation, the heat sink device 110 as depicted in FIG. 8 may be used for chips dissipating up to 50 watts. For chips dissipating in excess of 50 watts, a heat sink device 110a such as illustrated by FIG. 9 may be used. Heat sink 110a includes a body portion 142 having holes 144, 146 for allowing the passage of fluid therethrough. Chambers 134 and 136 are included within body portion 142 as well as a nozzle 138 which allows for fluid communication between chambers 134 and 136 via passage way 140. Nozzle 138 may be currently disposed within body portion 42 or releasably maintained therein and accessed by removal of top cap 148 and body portion 142. Bellows 114a includes a chamber 130 making the bellows of hollow construction. Bellows 114a is releaseably engaged with body portion 142 through engagement means 113a such as threaded engagement or the like. Sealing means 132 is provided such that a fluid type seal is maintained between body portion 142 and bellows 114a. Upon attachment of the bellows 114a to body portion 142 it can be seen that nozzle 138 protrudes into chamber 130 of bellows 114a. Next, assuming that a chip 65 is in thermal contact with and bellows 114a. and heat must be dissipated therefrom, the operation of heat sink 110a will now be described. Cold fluid, such as water, or the like flows through hole 146, into chamber 136 and through passageway 140, nozzle 138 and into chamber 130 of bellows 114a. Heat is then transferred to the fluid in chamber 130 which then flows out of chamber 130 through the annular area between nozzle 138 and the inside of chamber 130 into chamber 134 and out of hole 144 as heated fluid. It can be seen that by applying pressure to the fluid flowing through hole 146 and evacuating the fluid out of hole 144 the flow of the fluid through heat sink 110a will be increased. In this manner, high wattage logic chips may be cooled during burn-in utilizing the method and apparatus of the present invention.

It should be noted that for high wattage chips, point heat source 24 merely becomes a means of poorly cooling chip 65, rather than a means of elevating the temperature thereof. High wattage chip 65 will inherently elevate in temperature due to their electrical loading during testing.

The present invention includes a point heat source 24 which decreases the typical burn-in time and reduces thermal stress on carrier substrate 23 by applying heat directly to chips 25 and not to the entire chamber of chamber 1. It can be seen that by elevating the temperature of chip 65 further, solder balls 122 (FIG. 8) will reflow thereby permanently affixing chip (metallurgically joining) 65 onto carrier substrate 23. Of course, the temperature will not be further elevated unless all of the chips 65 associated with carrier substrate 23 successfully complete burn-in. Thus, subsequent to burn-in and reflow a product quality electronic component is produced and available for insertion on to a circuit board or the like.

Another problem associated with conventional burn-in methods is the formation of oxide near the solder paste 122 (shown in FIG. 8). In order to reduce and remove the formation of solder oxides, the present invention purges the chamber of the modular test oven 1 with a forming gas which may be composed of 95% nitrogen and 5% hydrogen. By reducing oxide formation during burn-in, the forming gas solves a problem experienced in conventional burn-in ovens and further ensures the integrity of the product level carrier substrate and chip 65 resulting from the burn-in apparatus and method as contemplated by the present invention.

Although certain preferred embodiments have been shown and described, it should be understood that many changes and modifications may be made therein without departing from the scope of the appended claims. For example, a specific point heat source as been described herein, however many other heat source configurations will provide the benefits of the present invention and are contemplated thereby.

What is claimed is:

1. An oven for testing a plurality of integrated circuits, comprising:
   means for receiving a production level carrier substrate, said carrier substrate having integrated circuits non-permanently affixed thereto;
   means for testing said non-permanently affixed integrated circuits;
   means for permanently affixing said integrated circuits to said production level carrier substrate upon successful testing of each said integrated circuits
   and means for heating said integrated circuits; each said means being located within said oven.

2. An apparatus according to claim 1 wherein said means for testing comprises:
   means for performing electrical testing upon said integrated circuits; and
   means for performing thermal testing upon said integrated circuits.

3. An apparatus according to claim 2 wherein said means for testing further comprises a variable temperature point heat source.

4. An apparatus according to claim 3 wherein said means for performing electrical testing comprises:
test circuit means for applying an electrical signal to said integrated circuits; and
means for electrically connecting said test circuit means with said integrated circuits.

5. An apparatus according to claim 4 wherein said means for performing thermal testing comprises:
means for aligning said integrated circuits with said variable temperature point heat source;
means for mating said integrated circuits with said point heat source, and for applying pressure therebetween; and
means for elevating the temperature of said point heat source to a predetermined level.

6. An apparatus according to claim 5 wherein said integrated circuits comprise plural input/output points each having solder proximate thereto.

7. An apparatus according to claim 6 wherein said means for permanently affixing comprises means for elevating the temperature of said point heat source beyond said predetermined level, thereby reflowing said solder and metallurgically joining said integrated circuits with said carrier substrate.

8. An apparatus according to claim 7 wherein said point heat source comprises:
sensor means for determining the temperature of said integrated circuit;
switch means for varying the temperature of said point heat source in accordance with said sensed temperature;
biasing means for maintaining contact between said point heat source and said integrated circuit; and
heat sink means for dissipating thermal energy from said integrated circuit.

9. An apparatus according to claim 8 wherein said point heat source is a peltier device.

10. An apparatus according to claim 8 wherein said heat sink means comprises means for circulating a fluid therethrough.

11. An apparatus according to claim 1 wherein said oven further comprises:
means for automatically inserting said carrier substrate into said oven;
means for automatically retrieving said carrier substrate from said oven; and
engagement means for removably coupling said automatic insertion means and said automatic retrieval means with said oven.

12. An apparatus according to claim 11 wherein a plurality of said ovens are provided.

13. An apparatus according to claim 12 wherein said means for automatically retrieving said carrier substrate from said oven comprises:
means for removing, from said carrier substrate, any of said integrated circuits which fail said testing;
means for discarding said failed integrated circuits; and
means for replacing said discarded integrated circuits with new integrated circuits to be tested.

14. An apparatus according to claim 13 wherein said carrier substrate is to be utilized in the manufacture of an electronic device.

* * * * *